(12) United States Patent
Jung et al.

(10) Patent No.: US 10,170,521 B2
(45) Date of Patent: Jan. 1, 2019

(54) ORGANIC LIGHT-EMITTING DIODE DISPLAY DEVICE

(71) Applicant: LG Display Co., Ltd., Seoul (KR)

(72) Inventors: Nack-Youn Jung, Seoul (KR); Heume-Il Baek, Goyang-si (KR); Myung-O Joo, Seoul (KR); Jeong-Mook Choi, Pyeongtaek-si (KR); Yun-Joo Jo, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/363,915

(22) Filed: Nov. 29, 2016

(65) Prior Publication Data

US 2017/0194385 A1 Jul. 6, 2017

(30) Foreign Application Priority Data

Dec. 30, 2015 (KR) .................. 10-2015-0190204
Oct. 25, 2016 (KR) .................. 10-2016-0139371

(51) Int. Cl.
*H01L 27/32* (2006.01)
*H01L 27/14* (2006.01)
(Continued)

(52) U.S. Cl.
CPC ...... *H01L 27/3206* (2013.01); *H01L 27/3246* (2013.01); *H01L 51/5056* (2013.01);
(Continued)

(58) Field of Classification Search
CPC ............ H01L 27/3206; H01L 27/3246; H01L 51/5056; H01L 51/5088; H01L 51/5265;
(Continued)

(56) References Cited

U.S. PATENT DOCUMENTS 7,030,553 B2 * 4/2006 Winters .............. H01L 27/3213
313/113
7,247,394 B2 * 7/2007 Hatwar .............. H01L 51/5265
257/89

(Continued)

FOREIGN PATENT DOCUMENTS

JP 2010-146846 A 7/2010
JP 2011/76769 A 4/2011
(Continued)

*Primary Examiner* — Ida M Soward
(74) *Attorney, Agent, or Firm* — Birch, Stewart, Kolasch & Birch, LLP

(57) ABSTRACT

An organic light-emitting diode display device according to an embodiment includes a substrate on which red, green and blue sub-pixel regions are defined, first electrodes in the red, green and blue sub-pixel regions, respectively, and first, second and third light-emitting layers on the first electrodes in the red, green and blue sub-pixel regions, respectively. The organic light-emitting diode display device further includes a second electrode on the first, second and third light-emitting layers, and red, green and blue color filters disposed on the second electrode and corresponding to the red, green and blue sub-pixel regions, respectively, wherein a thickness of the first light-emitting layer is smaller than a thickness of the second light emitting layer.

20 Claims, 8 Drawing Sheets

(51) Int. Cl.
  *H01L 51/50*   (2006.01)
  *H01L 51/52*   (2006.01)
  *H01L 27/146*    (2006.01)
  *G02F 1/1362*    (2006.01)
  *H01L 51/00*     (2006.01)

(52) U.S. Cl.
  CPC ...... *H01L 51/5088* (2013.01); *H01L 51/5265* (2013.01); *G02F 2001/136222* (2013.01); *H01L 27/14645* (2013.01); *H01L 27/322* (2013.01); *H01L 27/3211* (2013.01); *H01L 27/3216* (2013.01); *H01L 27/3218* (2013.01); *H01L 51/0072* (2013.01); *H01L 51/0085* (2013.01); *H01L 51/5012* (2013.01); *H01L 2251/558* (2013.01)

(58) Field of Classification Search
  CPC ............ H01L 27/3211; H01L 27/3216; H01L 27/3218; H01L 27/322; H01L 27/14645; G02F 2001/036222
  See application file for complete search history.

(56) References Cited

U.S. PATENT DOCUMENTS

| | | | |
|---|---|---|---|
| 7,531,856 B2 * | 5/2009 | Kobori | H01L 27/322 257/290 |
| 7,667,388 B2 * | 2/2010 | Ryu | H01L 51/5265 313/504 |
| 8,040,052 B2 * | 10/2011 | Kobayashi | H01L 27/3213 313/504 |
| 8,044,575 B2 * | 10/2011 | Kawamura | H01L 27/322 313/504 |
| 8,049,420 B2 * | 11/2011 | Tamura | H01L 27/3211 313/504 |
| 8,207,668 B2 * | 6/2012 | Cok | H01L 27/3213 313/506 |
| 8,648,363 B2 * | 2/2014 | Matsumoto | C09K 11/06 257/103 |
| 8,809,866 B2 * | 8/2014 | Iwasaki | H01L 33/08 257/315 |
| 8,847,857 B2 * | 9/2014 | Liu | G09G 3/30 345/76 |
| 8,878,164 B2 * | 11/2014 | Gather | H01L 51/5265 257/40 |
| 8,987,716 B2 * | 3/2015 | Lee | H01L 27/3216 257/40 |
| 9,087,797 B2 * | 7/2015 | Uetake | H01L 27/3213 |
| 9,231,154 B2 * | 1/2016 | Ikeda | H01L 33/26 |
| 9,530,828 B2 * | 12/2016 | Matsumi | H01L 51/5265 |
| 9,673,264 B2 * | 6/2017 | Ohsawa | H01L 27/3206 |
| 9,711,723 B2 * | 7/2017 | Ando | H01L 51/0004 |
| 9,716,208 B2 * | 7/2017 | Dozen | H01L 33/005 |
| 9,780,325 B2 * | 10/2017 | Lee | H01L 51/5218 |
| 2005/0280008 A1 * | 12/2005 | Ricks | C09K 11/06 257/79 |
| 2008/0002113 A1 * | 1/2008 | Abe | G02F 1/133371 349/107 |
| 2008/0143649 A1 * | 6/2008 | Asaki | H01L 51/5203 345/76 |
| 2010/0156279 A1 | 6/2010 | Tamura et al. | |
| 2010/0156280 A1 * | 6/2010 | Song | H01L 51/5265 313/504 |
| 2011/0062476 A1 * | 3/2011 | Tobise | G02B 3/0031 257/98 |
| 2012/0261683 A1 * | 10/2012 | Sonoyama | H01L 27/3211 257/89 |
| 2013/0082589 A1 * | 4/2013 | So | H01L 51/5036 313/504 |
| 2013/0234121 A1 * | 9/2013 | Sonoyama | H01L 51/5012 257/40 |
| 2013/0302937 A1 * | 11/2013 | Jinbo | H01L 51/50 438/99 |
| 2014/0021858 A1 * | 1/2014 | Wolk | H01L 27/3211 313/506 |
| 2014/0110682 A1 | 4/2014 | Shih | |
| 2014/0117339 A1 * | 5/2014 | Seo | H01L 51/504 257/40 |
| 2014/0139102 A1 | 5/2014 | Jeon et al. | |
| 2014/0167604 A1 * | 6/2014 | Iwata | H05B 33/22 313/504 |
| 2014/0342483 A1 * | 11/2014 | Liu | G09G 3/30 438/34 |
| 2015/0346548 A1 * | 12/2015 | Kubota | G02F 1/133371 349/113 |
| 2016/0071894 A1 * | 3/2016 | Lee | H01L 27/14621 348/222.1 |
| 2016/0327803 A1 * | 11/2016 | Yamazaki | G02B 27/22 |
| 2017/0133437 A1 * | 5/2017 | Komatsu | H01L 27/3206 |
| 2018/0197923 A1 * | 7/2018 | Kashiwabara | H01L 27/3211 |

FOREIGN PATENT DOCUMENTS

| | | |
|---|---|---|
| JP | 2011-210677 A | 10/2011 |
| JP | 2012/011266 A | 1/2012 |
| JP | 2012-516848 A | 7/2012 |
| JP | 2012-248432 A | 12/2012 |
| KR | 20080061675 A * | 7/2008 |
| TW | I411350 B | 10/2013 |
| TW | 201417260 A | 5/2014 |
| WO | WO 2014/0112266 A1 | 1/2012 |
| WO | WO 2014/156021 A1 | 10/2014 |

* cited by examiner

ORGANIC LIGHT-EMITTING DIODE DISPLAY DEVICE

CROSS-REFERENCE TO RELATED APPLICATION

The present application claims priority from and the benefit under 35 U.S.C § 119(a) of Korean Patent Application Nos. 10-2015-0190204, filed in the Republic of Korea on Dec. 30, 2015, and 10-2016-0139371, filed in the Republic of Korea on Oct. 25, 2016, which are hereby incorporated by reference in their entirety.

BACKGROUND

Field of the Disclosure

The present disclosure relates to an organic light-emitting diode display device, and more particularly, to an organic light-emitting diode display device capable of improving a lifetime.

Discussion of the Related Art

Recently, flat panel displays have been widely developed and applied to various fields because of their thin profile, light weight, and low power consumption.

Among the flat panel displays, organic light-emitting diode (OLED) display devices, which can be referred to as organic electroluminescent display devices, emit light during loss of electron-hole pairs. The electron-hole pairs are formed by injecting charges into a light-emitting layer between a cathode for injecting electrons and an anode for injecting holes.

The OLED display devices can be formed on a flexible substrate such as plastic. Since they are self-luminous, the OLED display devices have excellent contrast ratios. The OLED display devices have a response time of several micro seconds, and there are advantages in displaying moving images. In addition, the OLED display devices have wide viewing angles as they are self-luminous.

OLED display devices are divided into passive matrix type OLED display devices and active matrix type OLED display devices according to a driving method. Active matrix type display devices having a low power consumption and a high definition are widely used. In addition, the size of active matrix type display devices can be large.

An OLED display device includes a plurality of pixels to express various colors. Each pixel includes red, green and blue sub-pixels, and red, green and blue organic light-emitting diodes are formed in the red, green and blue sub-pixels, respectively.

The red, green and blue organic light-emitting diodes include red, green and blue light-emitting material layers, respectively, and each light-emitting material layer is formed by a thermal evaporation method. More particularly, the light-emitting material layer is formed by selectively vacuum evaporating an organic light-emitting material using a fine metal mask. However, the thermal evaporation method is difficult to apply to display devices having a large size and high definition due to manufacturing deviations, sagging and a shadow effect of the metal mask.

To solve this problem, a method of forming the light-emitting material layer through a solution process has been suggested. In the solution process, a bank layer surrounding a pixel region is formed, a light-emitting material is dropped in the pixel region surrounded by the bank layer by scanning a nozzle of injection apparatus in a certain direction, and the dropped light-emitting material is hardened to form the light-emitting material layer. At this time, a hole injecting layer and a hole transporting layer also may be formed through the solution process.

By the way, the red, green and blue light-emitting materials each have different characteristics. Specially, the red light-emitting material has relative low efficiency and the green light-emitting material has relatively short lifetime. Thus, it is not easy to secure red, green and blue light-emitting materials having uniform lifetime and efficiency, and a lifetime of the OLED display device is reduced.

Meanwhile, reflection of the external light is high in the OLED display device. The reflection of the external light increases the brightness at black state, which reduces the contrast ratio and degrades image qualities. Thus, in order to prevent the reflection of the external light, at least one polarizer is used, and this causes an increase in costs.

SUMMARY

Accordingly, one aspect of the present disclosure is to provide an OLED display device that substantially obviates one or more of the problems due to limitations and disadvantages of the related art.

An object of the present disclosure is to provide an OLED display device that increases a lifetime.

Another object of the present disclosure is to provide an OLED display device that decreases costs.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, there is provided an organic light-emitting diode display device. In one aspect, an organic light-emitting diode display device includes a substrate on which red, green and blue sub-pixel regions are defined; first electrodes in the red, green and blue sub-pixel regions, respectively; first, second and third light-emitting layers on the first electrodes and in the red, green and blue sub-pixel regions, respectively; a second electrode on the first, second and third light-emitting layers; and red, green and blue color filters disposed on the second electrode and corresponding to the red, green and blue sub-pixel regions, respectively, wherein a thickness of the first light-emitting layer is smaller than a thickness of the second light emitting layer.

Further scope of applicability of the present invention will become apparent from the detailed description given hereinafter. However, the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to the embodiment of the disclosure, an example of which is illustrated in the accompanying drawings. Words of 'on' and 'under' are used only for describing a direction in the following explanations and thus are not limited to 'directly on' and 'directly under'.

Figure 1:
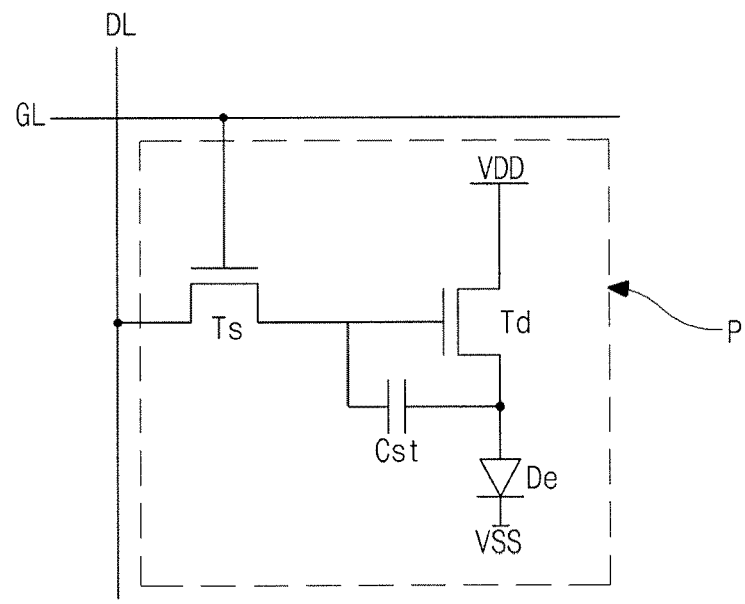
FIG. 1 is a circuit diagram of one pixel region of an OLED display device according to an embodiment of the present disclosure.

FIG. 1 is a circuit diagram of one pixel region of an OLED display device according to an embodiment of the present disclosure.

As shown in FIG. 1, the OLED display device according to the embodiment of the present disclosure includes a gate line GL, a data line DL, a switching thin film transistor Ts, a driving thin film transistor Td, a storage capacitor Cst and an organic light-emitting diode De. The gate line GL and the data line DL cross each other to define a pixel region P. The switching thin film transistor Ts, the driving thin film transistor Td, the storage capacitor Cst and the organic light-emitting diode De are formed in the pixel region P.

More particularly, a gate electrode of the switching thin film transistor Ts is connected to the gate line GL, and a source electrode of the switching thin film transistor Ts is connected to the data line DL. A gate electrode of the driving thin film transistor Td is connected to a drain electrode of the switching thin film transistor Ts, and a source electrode of the driving thin film transistor Td is connected to a high voltage supply VDD. An anode of the organic light-emitting diode De is connected to a drain electrode of the driving thin film transistor Td, and a cathode of the organic light-emitting diode De is connected to a low voltage supply VSS. The storage capacitor Cst is connected to the gate electrode and the drain electrode of the driving thin film transistor Td.

The OLED display device is driven to display an image. More particularly, when the switching thin film transistor Ts is turned on by a gate signal applied through the gate line GL, a data signal from the data line DL is applied to the gate electrode of the driving thin film transistor Td and an electrode of the storage capacitor Cst through the switching thin film transistor Ts. When the driving thin film transistor Td is turned on by the data signal, an electric current flowing through the organic light-emitting diode De is controlled, thereby displaying an image. The organic light-emitting diode De emits light due to the current supplied through the driving thin film transistor Td from the high voltage supply VDD.

Namely, the amount of the current flowing through the organic light-emitting diode De is proportional to the magnitude of the data signal, and the intensity of light emitted by the organic light-emitting diode De is proportional to the amount of the current flowing through the organic light-emitting diode De. Thus, the pixel regions P show different gray levels depending on the magnitude of the data signal, and as a result, the OLED display device displays an image.

In addition, the storage capacitor Cst maintains charges corresponding to the data signal for a frame when the switching thin film transistor Ts is turned off. Accordingly, even if the switching thin film transistor Ts is turned off, the storage capacitor Cst allows the amount of the current flowing through the organic light-emitting diode De to be constant and the gray level shown by the organic light-emitting diode De to be maintained until a next frame.

However, the OLED display device according to the embodiment of the present disclosure is not limited to the illustrated example. Alternatively, at least one thin film transistor, at least one signal line and/or at least one capacitor for compensation may be further formed in each pixel region.

Figure 2:
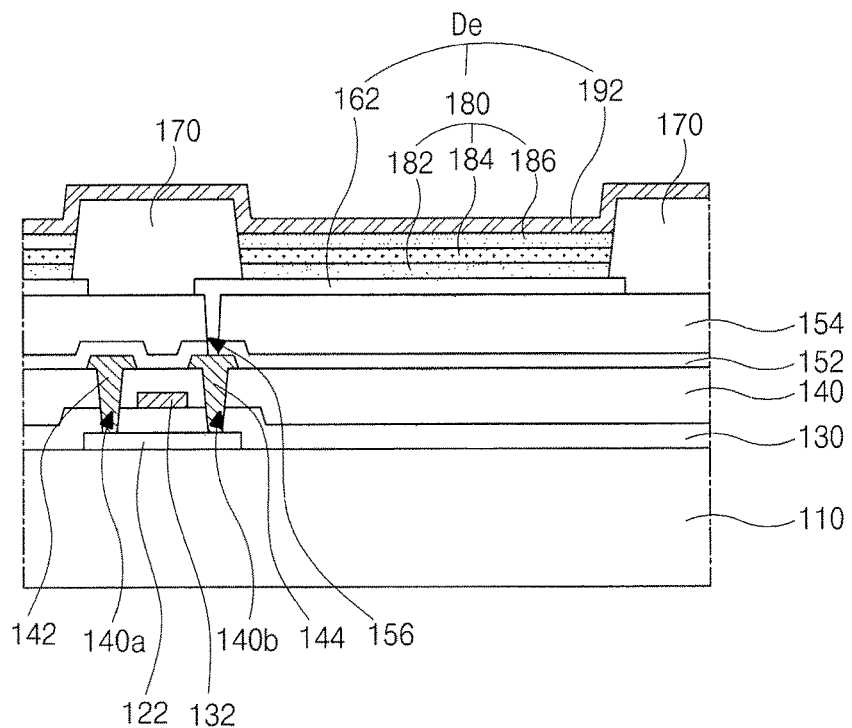
FIG. 2 is a cross-sectional view of an OLED display device according to the embodiment of the present disclosure.

FIG. 2 is a cross-sectional view of an OLED display device according to the embodiment of the present disclosure and shows a pixel region.

In FIG. 2, a semiconductor layer 122 is patterned and formed on an insulating substrate 110. The substrate 110 can be a glass substrate or a plastic substrate. The semiconductor layer 122 can be formed of an oxide semiconductor material. In the OLED display device including the semiconductor layer 122 formed of an oxide semiconductor material, a light-blocking pattern and a buffer layer may be formed under the semiconductor layer 122. The light-blocking pattern blocks light from the outside or light emitted from a light-emitting diode to prevent the semiconductor layer 122 from being degraded by the light. Alternatively, the semiconductor layer 122 can be formed of polycrystalline silicon, and in this case, impurities can be doped in both sides of the semiconductor layer 122.

A gate insulating layer 130 of an insulating material is formed on the semiconductor layer 122 over substantially all of the substrate 110. The gate insulating layer 130 can be formed of an inorganic insulating material such as silicon oxide ($SiO_2$). When the semiconductor layer 122 is formed of polycrystalline silicon, the gate insulating layer 130 can be formed of silicon oxide ($SiO_2$) or silicon nitride (SiNx).

A gate electrode 132 made of a conductive material such as metal can be formed on the gate insulating layer 130 to correspond to the semiconductor layer 122. In addition, a gate line and a first capacitor electrode can be formed on the gate insulating layer 130. The gate line extends in a first direction, and the first capacitor electrode can be connected to the gate electrode 132.

The OLED display device according to the embodiment of the present disclosure includes the gate insulating layer 130 formed over substantially all of the substrate 110. Alternatively, the gate insulating layer 130 can be patterned to have the same shape as the gate electrode 132.

Further, an inter insulating layer 140 of an insulating material is formed on the gate electrode 132 over substantially all of the substrate 110. The inter insulating layer 140 can be formed of an inorganic insulating material such as silicon oxide ($SiO_2$) and silicon nitride (SiNx) or an organic insulating material such as benzocyclobutene and photo acryl.

In addition, the inter insulating layer 140 includes first and second contact holes 140a and 140b exposing top surfaces of both sides of the semiconductor layer 122. The first and second contact holes 140a and 140b are spaced apart from the gate electrode 132, and the gate electrode 132 is disposed between the first and second contact holes 140a and 140b. The first and second contact holes 140a and 140b are also formed in the gate insulating layer 130. Alternatively, when the gate insulating layer 130 is patterned to have the same shape as the gate electrode 132, the first and second contact holes 140a and 140b are formed only in the inter insulating layer 140.

A source electrode 142 and a drain electrode 144 of a conductive material such as metal are formed on the inter insulating layer 140. In addition, a data line, a power supply line and a second capacitor electrode can be formed on the inter insulating layer 140. The data line and the power supply line extend in a second direction.

Further, the source and drain electrodes 142 and 144 are spaced apart from each other with respect to the gate electrode 132. The source and drain electrodes 142 and 144 contact both sides of the semiconductor layer 122 through the first and second contact holes 140a and 140b, respectively. The data line can cross the gate line to define the pixel region. In addition, the power supply line supplying a high level voltage can be spaced apart from the data line. The second capacitor electrode can be connected to the drain electrode 144 and can overlap the first capacitor electrode to form a storage capacitor with the inter insulating layer 140 therebetween as a dielectric substance.

As shown in FIG. 2, in the OLED display device, a thin film transistor includes the semiconductor layer 122, the gate electrode 132, the source electrode 142 and the drain electrode 144. The thin film transistor can have a coplanar structure where the gate electrode 132 and the source and drain electrodes 142 and 144 are disposed at a side of the semiconductor layer 122, i.e., over the semiconductor layer 122.

Alternatively, the thin film transistor can have an inverted staggered structure where the gate electrode is disposed under the semiconductor layer and the source and drain electrodes are disposed over the semiconductor layer. In this case, the semiconductor layer can be formed of amorphous silicon.

In addition, the thin film transistor can be a driving thin film transistor of the OLED display device. A switching thin film transistor can have the same structure as the driving thin film transistor formed over the substrate 110. At this time, the gate electrode 132 of the driving thin film transistor is connected to a drain electrode of the switching thin film transistor, and the source electrode 142 of the driving thin film transistor is connected to the power supply line. In addition, the gate electrode and the source electrode of the switching thin film transistor are connected to the gate line and the data line, respectively.

A first passivation layer 152 and a second passivation layer 154 of insulating materials are sequentially formed on the source and drain electrodes 142 and 144 over substantially all of the substrate 110. The first passivation layer 152 can be formed of an inorganic insulating material such as silicon oxide ($SiO_2$) and silicon nitride (SiNx), and the second passivation layer 154 can be formed of an organic insulating material such as benzocyclobutene and photo acryl. The second passivation layer 154 can have a flat top surface.

Further, the first passivation layer 152 and the second passivation layer 154 have a drain contact hole 156 exposing the drain electrode 144. In FIG. 2, although the drain contact hole 156 is formed directly over the second contact hole 140b, the drain contact hole 156 can be spaced apart from the second contact hole 140b.

One of the first passivation layer 152 and the second passivation layer 154 can be omitted. For example, the first passivation layer 152 of an inorganic insulating material can be omitted.

A first electrode 162 of a conductive material having a relatively high work function is formed on the second passivation layer 154. The first electrode 162 is disposed in each pixel region and contacts the drain electrode 144 through the drain contact hole 156. For example, the first electrode 162 can be formed of a transparent conductive material such as indium tin oxide (ITO) and indium zinc oxide (IZO).

A bank layer 170 of an insulating material is formed on the first electrode 162. The bank layer 170 is disposed between adjacent pixel regions, has an opening exposing the first electrode 162, and covers edges of the first electrode 162.

Figure 7:
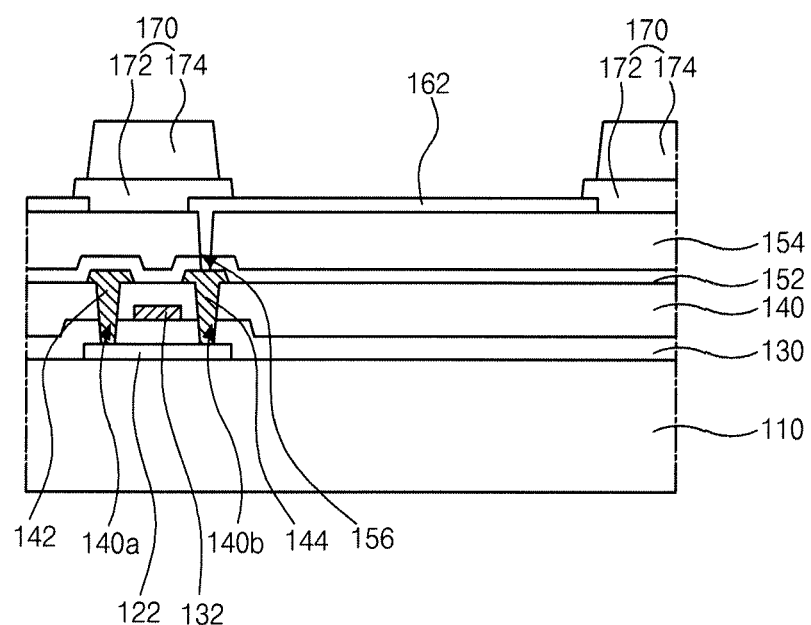
FIG. 7 illustrates a bank layer arrangement in an OLED display device according to an embodiment of the present disclosure.

As shown, in the OLED display device, the bank layer 170 has a single-layered structure. However, the structure of the bank layer 170 is not limited to this. For example, and as shown in FIG. 7, the bank layer 170 can have a double-layered structure. That is, the bank layer 170 can include a first bank 172 and a second bank 174 on the first bank 172, and the first bank 172 can have a wider width than the second bank 174. At this time, the first bank 172 can be formed of an inorganic insulating material or organic insulating material having a hydrophilic property, and the second bank 174 can be formed of an organic insulating material having a hydrophobic property.

In addition, a light-emitting layer 180 is formed on the first electrode 162 exposed by the opening of the bank layer 170. The light-emitting layer 180 includes a hole auxiliary layer 182, a light-emitting material layer (EML) 184, and an electron auxiliary layer 186, which are sequentially disposed from a top surface of the first electrode 162.

In more detail, the hole auxiliary layer 182, the light-emitting material layer 184 and the electrode auxiliary layer 186 can be formed of organic materials and can be formed through a solution process, which may be referred to as a soluble process. Accordingly, manufacturing processes can be simplified, and a display device having a large size and high definition can be provided. One of a spin coating method, an inkjet printing method and a screen printing method can be used for the solution process.

Alternatively, the hole auxiliary layer 182, the light-emitting material layer 184 and the electrode auxiliary layer 186 can be formed through a vacuum evaporation process. In addition, the hole auxiliary layer 182, the light-emitting material layer 184 and the electrode auxiliary layer 186 can be formed by a combination of the solution process and the vacuum evaporation process.

The hole auxiliary layer 182 can include at least one of a hole injecting layer (HIL) and a hole transporting layer (HTL), and the electron auxiliary layer 186 can include at least one of an electron injecting layer (EIL) and an electrode transporting layer (ETL).

A second electrode 192 of a conductive material having relatively low work function is formed on the electron auxiliary layer 186 over substantially all of the substrate 110. Here, the second electrode 192 can be formed of aluminum (Al), magnesium (Mg), silver (Ag) or their alloy.

The first electrode 162, the light-emitting layer 180 and the second electrode 192 constitute an organic light-emitting diode De. The first electrode 162 functions as an anode, and the second electrode 192 serves as a cathode. Here, the OLED display device according to the embodiment of the present disclosure is an active matrix type and is a top emission type in which light from the light-emitting material layer 184 is outputted to the outside through the second electrode 192. In this case, the first electrode 162 can further include a reflection layer formed of an opaque conductive material. For example, the reflection layer can be formed of aluminum-paladium-copper (APC) alloy, and the first electrode 162 can have a triple-layered structure of ITO/APC/ITO. In addition, the second electrode 192 can have a relatively thin thickness such that light is transmitted therethrough. For example, the second electrode 192 can have transmittance of about 45% to 50%.

The OLED display device according to the embodiment of the present disclosure includes a plurality of pixels, and each pixel includes red, green and blue sub-pixels. The thin film transistor and the organic light-emitting diode of FIG. 2 are formed in each red, green and blue sub-pixel region.

At this time, the organic light-emitting diodes of the red, green and blue sub-pixels have different element thicknesses. This will be described in more detail with reference to accompanying drawings.

Figure 3:
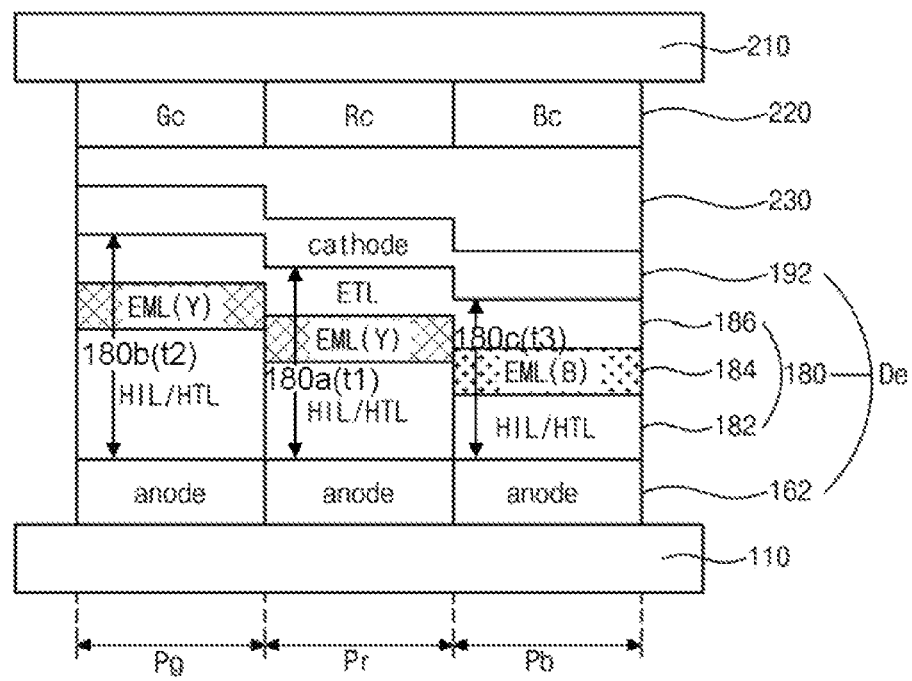
FIG. 3 is a schematic view of red, green and blue sub-pixels of an OLED display device according to the embodiment of the present disclosure.

FIG. 3 is a schematic view of red, green and blue sub-pixels of an OLED display device according to the embodiment of the present disclosure.

In FIG. 3, red, green and blue sub-pixel regions Pr, Pg and Pb are defined on a substrate 110, and an organic light-emitting diode De is disposed in each sub-pixel region Pr, Pg and Pb. The organic light-emitting diode De in each sub-pixel region Pr, Pg and Pb includes a first electrode 162, a light-emitting layer 180 and a second electrode 192.

The first electrode 162 can be an anode and can be formed of a conductive material having relatively high work function. The first electrode 162 can include a transparent conductive material such as indium tin oxide (ITO) and indium zinc oxide (IZO). In addition, the first electrode 162 can further include a reflection layer at its lowest portion.

Even if the first electrodes 162 are connected to each other in the red, green and blue sub-pixel regions Pr, Pg and Pb, the first electrodes 162 are separated from each other by the red, green and blue sub-pixel regions Pr, Pg and Pb.

The light-emitting layer 180 is disposed on the first electrode 162 in each sub-pixel region Pr, Pg and Pb. The light-emitting layer 180 includes a hole auxiliary layer 182, a light-emitting material layer 184 and an electron auxiliary layer 186.

Here, the light-emitting material layers 184 of the red and green sub-pixel regions Pr and Pg include a yellow light-emitting material, and the light-emitting material layer 184 of the blue sub-pixel region Pb includes a blue light-emitting material.

The light-emitting material layers 184 can be formed through a solution process. Alternatively, the light-emitting material layers 184 can be formed through a solution process and a vacuum evaporation process. Namely, the light-emitting material layers 184 of the red and green sub-pixel regions Pr and Pg can be formed through the solution process, and the light-emitting material layer 184 of the blue sub-pixel region Pb can be formed through the vacuum evaporation process.

Moreover, the hole auxiliary layer 182 can include a hole injecting layer (HIL) and a hole transporting layer (HTL). At this time, the hole auxiliary layers 182 of the red, green and blue sub-pixel regions Pr, Pg and Pb can have different thicknesses. More particularly, the thickness of the hole auxiliary layer 182 of the red sub-pixel region Pr is smaller than the thickness of the hole auxiliary layer 182 of the green sub-pixel region Pg and is larger than the thickness of the hole auxiliary layer 182 of the blue sub-pixel region Pb.

The hole auxiliary layers 182 can be formed through the solution process, and the thicknesses of the hole auxiliary layers 182 can be adjusted by changing the amount of dropped solution.

In the meantime, the electron auxiliary layer 186 can include an electron transporting layer (ETL). The electron auxiliary layer 186 can further include an electron injecting layer on the electron transporting layer ETL. The electron auxiliary layer 186 can be formed through the vacuum evaporation process.

The second electrode 192 as a cathode is disposed on the light-emitting layers 180 of the red, green and blue sub-pixel regions Pr, Pg and Pb. The second electrode 192 can be formed of aluminum (Al), magnesium (Mg), silver (Ag) or their alloy. The second electrode 192 can have a relatively thin thickness such that light can be transmitted therethrough.

An encapsulation layer 200 is formed on the organic light-emitting diode De to protect the organic light-emitting diode De from moisture and oxygen from the outside. The encapsulation layer 200 can be formed of ultraviolet (UV) sealant or frit sealant. Alternatively, the encapsulation layer 200 can be formed of inorganic layers and organic layers, which are alternately disposed.

A color filter layer 220 is disposed on the encapsulation layer 200. The color filter layer 220 can include red, green and blue color filters Rc, Gc and Bc corresponding to the red, green and blue sub-pixel regions Pr, Pg and Pb. Here, the blue color filter Bc can be omitted.

An overcoat layer can be further formed between the encapsulation layer 200 and the color filter layer 220 to protect the color filter layer 220 and to planarize a top surface of the encapsulation layer 200.

An opposite substrate 210 is disposed on the color filter layer 220. The opposite substrate 210 can be a glass substrate or a plastic substrate.

Here, the color filter layer 220 can be formed on the opposite substrate 210, and the opposite substrate 210 including the color filter layer 220 thereon can be attached to the substrate 110 including the organic light-emitting diode De.

The OLED display device according to the embodiment of the present disclosure can be a top emission type where light from the light-emitting layer 180 is outputted to the outside through the second electrode 192.

As stated above, in the OLED display device according to the embodiment of the present disclosure, the organic light-emitting diodes De of the red, green and blue sub-pixel regions Pr, Pg and Pb have different element thicknesses. That is, when each of the organic light-emitting diodes De of the red, green and blue sub-pixel regions Pr, Pg and Pb has a distance from a bottom surface of the first electrode 162 and a bottom surface of the second electrode 192 as an element thickness, the element thickness of the organic light-emitting diode De of the red sub-pixel region Pr is smaller than the element thickness of the organic light-emitting diode De of the green sub-pixel region Pg and is larger than the element thickness of the organic light-emitting diode De of the blue sub-pixel region Pb.

At this time, the element thicknesses of the organic light-emitting diodes De of the red, green and blue sub-pixel regions Pr, Pg and Pb can be different from each other by differing thicknesses of the light-emitting layers 180, and more particularly, thicknesses of the hole auxiliary layers 182. Namely, the hole auxiliary layer 182 of the red sub-pixel region Pr is formed to have the thickness smaller than the thickness of the hole auxiliary layer 182 of the green sub-pixel region Pg and larger than the thickness of the hole auxiliary layer 182 of the blue sub-pixel region Pb. Therefore, a thickness t1 of a first light-emitting layer 180a of the red sub pixel region Pr is smaller than a thickness t2 of a second light-emitting layer 180b of the green sub-pixel region Pg and larger than a thickness t3 of a third light-emitting layer 180c of the blue sub-pixel region Pb.

The thicknesses of the hole auxiliary layers 182 can be determined by considering a microcavity effect, which is further explained below with reference to FIGS. 6A to 6C.

Figure 6A:
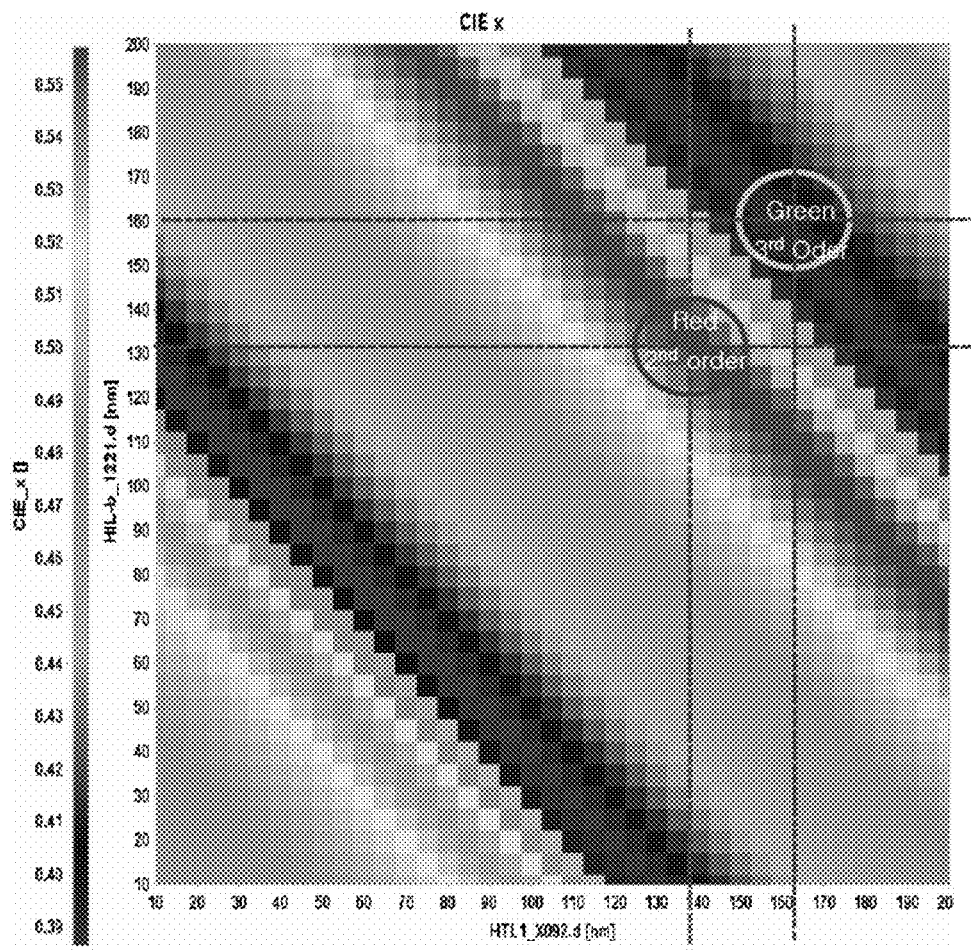
FIG. 6A is a view illustrating CIE x color coordinate depending on a thickness of a hole auxiliary layer.
Figure 6B:
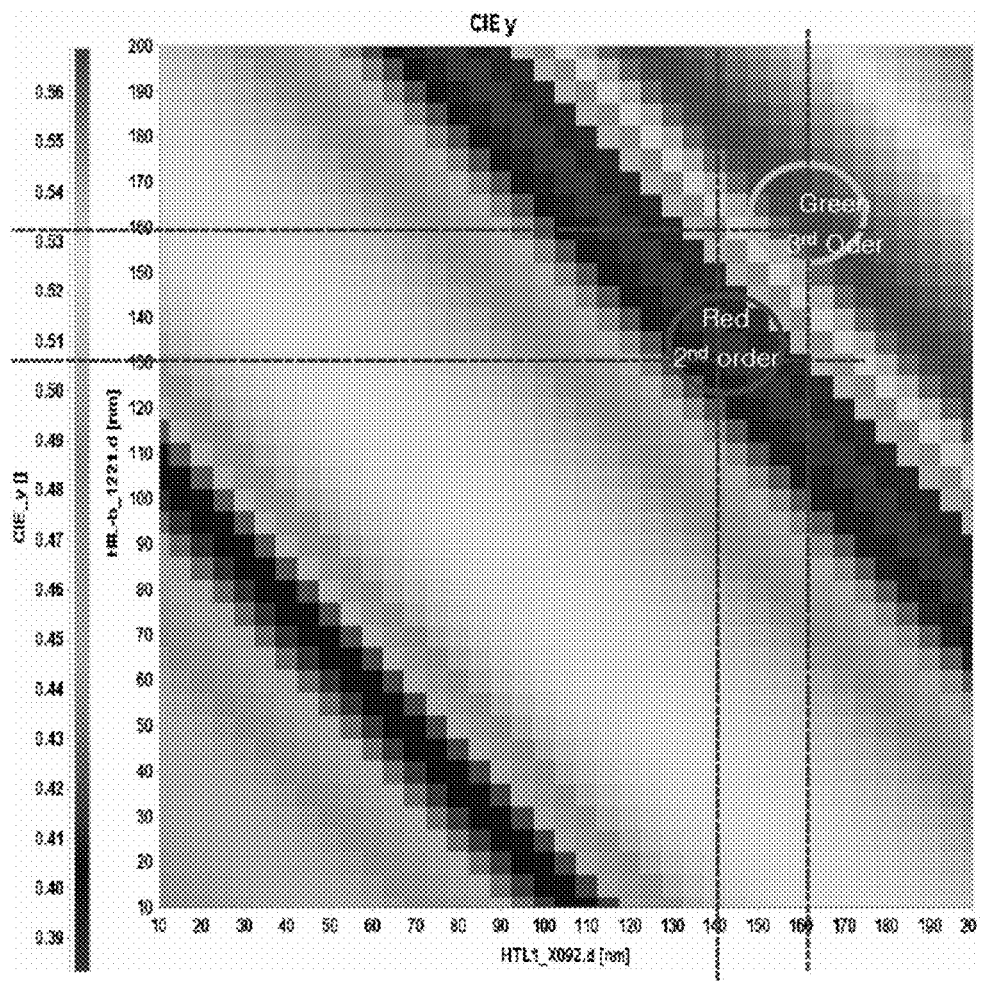
FIG. 6B is a view illustrating CIE y color coordinate depending on the thickness of the hole auxiliary layer.
Figure 6C:
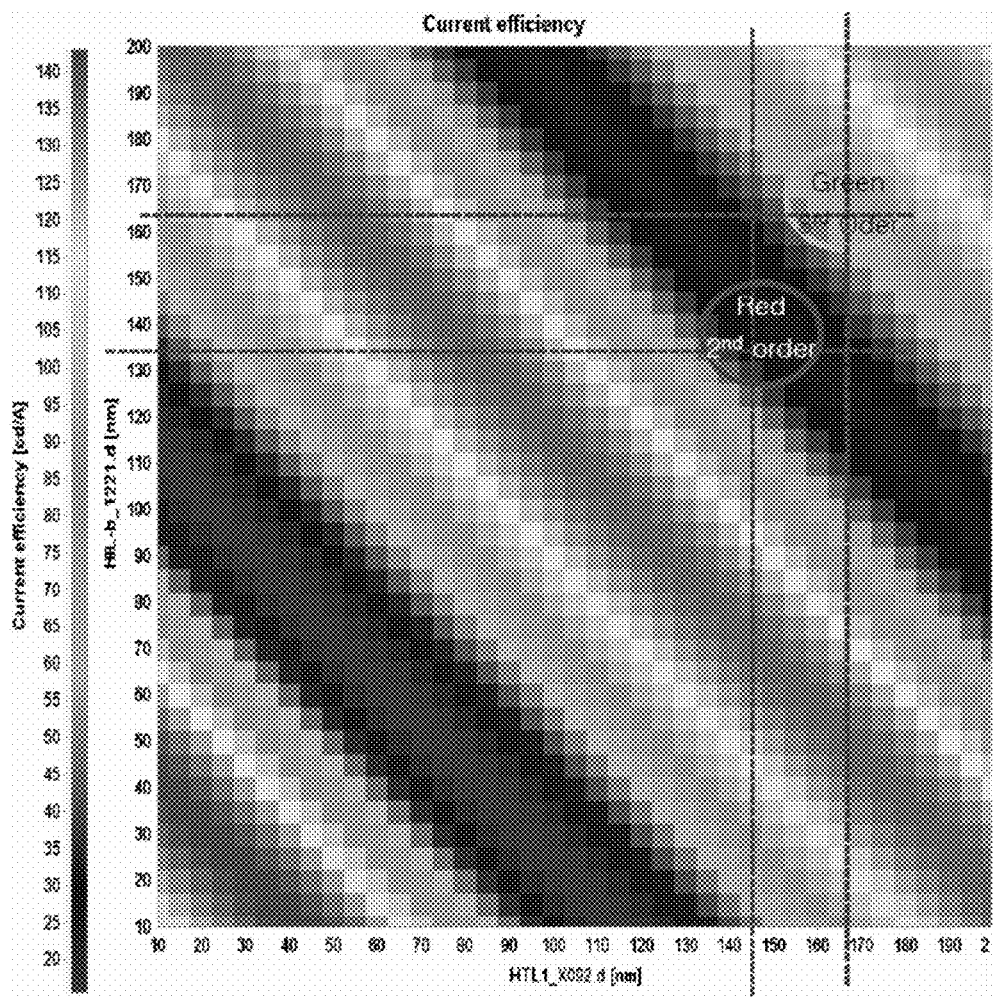
FIG. 6C is a view illustrating current efficiency depending on the thickness of the hole auxiliary layer. Additionally.

FIG. 6A is a view illustrating CIE x color coordinate depending on a thickness of a hole auxiliary layer, FIG. 6B is a view illustrating CIE y color coordinate depending on the thickness of the hole auxiliary layer, and FIG. 6C is a view illustrating current efficiency depending on the thickness of the hole auxiliary layer. In FIGS. 6A to 6C, to obtain relatively high current efficiency and satisfy required color coordinates, it is desirable that the thickness of the hole auxiliary layer 182 of the red sub-pixel region Pr is smaller than the thickness of the hole auxiliary layer 182 of the green sub-pixel Pg.

Especially, it is beneficial that the hole auxiliary layer 182 of the red sub-pixel region Pr has a thickness corresponding to a second order cavity condition and the hole auxiliary layer 182 of the green sub-pixel region Pg has a thickness corresponding to a third order cavity condition. As stated above, the hole auxiliary layer 182 includes at least one of a hole injecting layer and a hole transporting layer, and a total thickness of the hole injecting layer and the hole transporting layer becomes the thickness of the hole auxiliary layer 182. Thus, the total thickness of the hole injecting layer and the hole transporting layer in the red sub-pixel region Pr corresponds to the second order cavity condition, and the total thickness of the hole injecting layer and the hole transporting layer in the green sub-pixel region Pg corresponds to the third order cavity condition. If the hole auxiliary layer 182 of the red sub-pixel region Pr has a thickness corresponding to a lower order cavity condition than the second order cavity condition, a lifetime of the organic light-emitting diode may be decreased, and if the hole auxiliary layer 182 of the green sub-pixel region Pg has a thickness corresponding to an upper order cavity condition than the third order cavity condition, a driving voltage may be increased.

For example, the thickness of the hole auxiliary layer 182 of the red sub-pixel region Pr can be 250 nm to 280 nm, the thickness of the hole auxiliary layer 182 of the green sub-pixel region Pg can be 310 nm to 330 nm. At this time, if the thickness of the hole auxiliary layer 182 in each of the red and green sub-pixel regions Pr and Pg is not within the above-mentioned range, yellow light is mixed and emitted in each of the red and green sub-pixel regions Pr and Pg, and the color coordinates are not matched. Meanwhile, the thickness of the hole auxiliary layer 182 of the blue sub-pixel region Pb can be 30 nm to 70 nm.

At this time, the thicknesses of the hole auxiliary layers 182 can be changed by controlling thicknesses of the hole injecting layer HIL and/or the hole transporting layer HTL of the red, green and blue sub-pixel regions Pr, Pg and Pb. In general, since carrier mobility of the hole transporting layer HTL is larger than that of the hole injecting layer HIL, it is beneficial that the thickness of the hole transporting layer HTL is less changed than the thickness of the hole injecting layer HIL.

Meanwhile, as mentioned above, the light-emitting material layers 184 of the organic light-emitting diodes De of the red and green sub-pixel regions Pr and Pg include the yellow light-emitting material. The yellow light-emitting material has a relatively long lifetime and emits yellowish red light or yellowish green light using the microcavity effect.

Accordingly, the OLED display device according to the embodiment of the present disclosure can produce red and green light using the yellow light-emitting material, the microcavity effect and the color filters.

Figure 4:
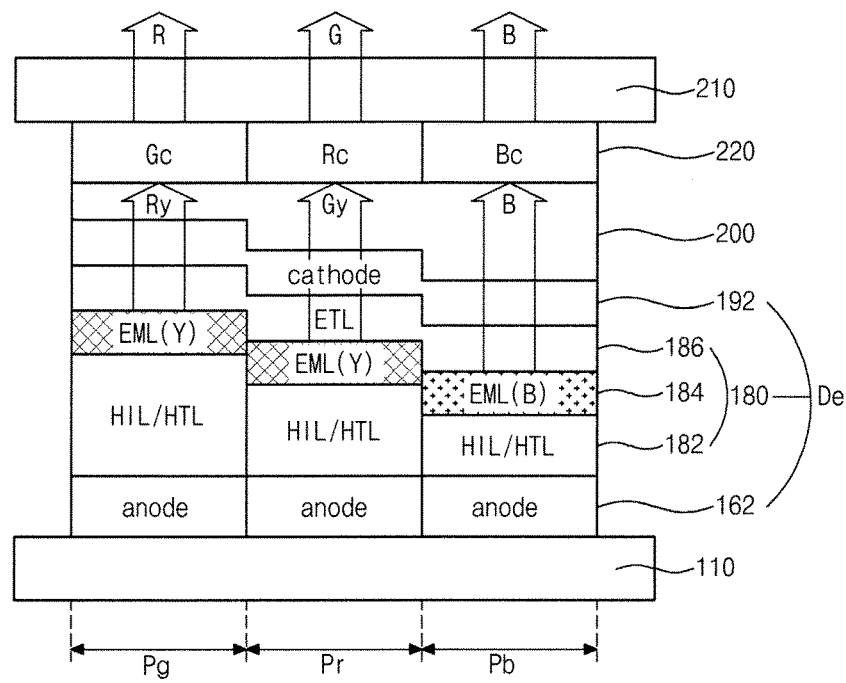
FIG. 4 is a schematic cross-sectional view showing light outputted from an OLED display device according to the embodiment of the present disclosure.
Figure 5A:
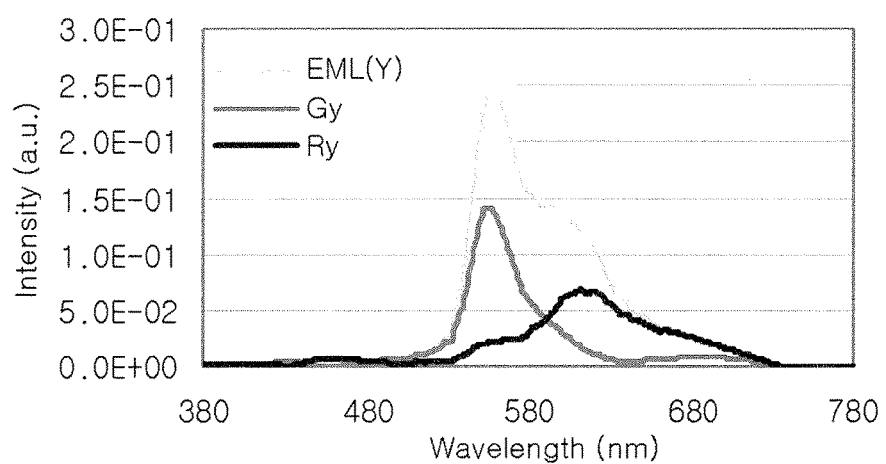
FIG. 5A is a view illustrating spectra of light emitted from organic light-emitting diodes of red and green sub-pixel regions of the OLED display device according to the embodiment of the present disclosure.

FIG. 4 is a schematic cross-sectional view showing light outputted from an OLED display device according to the embodiment of the present disclosure. FIG. 5A is a view illustrating spectra of light emitted from organic light-emitting diodes of red and green sub-pixel regions of the OLED display device according to the embodiment of the present disclosure, and FIG. 5B is a view illustrating spectra of light outputted from the red and green sub-pixel regions of the OLED display device according to the embodiment of the present disclosure.

Figure 5B:
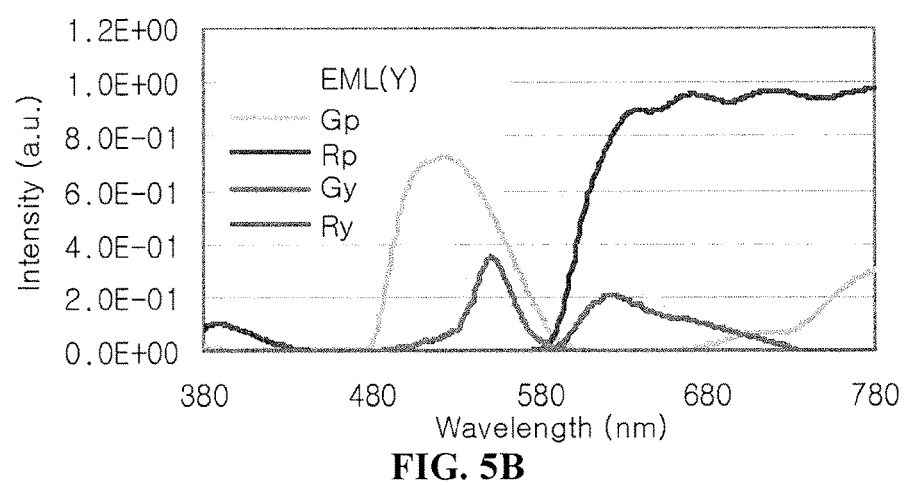
FIG. 5B is a view illustrating spectra of light outputted from the red and green sub-pixel regions of the OLED display device according to the embodiment of the present disclosure.

In FIGS. 4, 5A and 5B, the light-emitting material layers 184 of the red and green sub-pixel regions Pr and Pg include a yellow light-emitting material, and the yellow light-emitting material includes first and second emission peaks. At this time, the yellow light-emitting material can have the first emission peak in a wavelength range of 530 nm to 555 nm and the second emission peak in a wavelength range of 590 nm to 620 nm. For example, the yellow light-emitting material can include 4,4'-N,N'-dicarbazole-biphenyl (CBP) and also can include bis[2-(4-tertbutylphenyl)benzothiazolato-N,C2']iridium(acetylactonate)[(t-bt)2Ir(acac)] as a dopant.

Here, in the red sub-pixel region Pr, the light-emitting material layer 184 including the yellow light-emitting material emits orange light, i.e., yellowish red light Ry due to the microcavity effect. The yellowish red light Ry passes through the red color filter Rc, and thus deep red light R is outputted.

Additionally, in the green sub-pixel region Pg, the light-emitting material layer 184 including the yellow light-emitting material emits yellowish green light Gy due to the microcavity effect. The yellowish green light Gy passes through the green color filter Gc, and thus deep green light G is outputted.

Meanwhile, in the blue sub-pixel region Pb, the light-emitting material layer 184 includes a blue light-emitting material and emits blue light B. The blue light B passes through the blue color filter Bc, and thus deep blue light B is outputted.

Like this, the OLED display device according to the present disclosure can produce deep red light and deep green light by applying the yellow light-emitting material, which has a relatively long lifetime, to the red and green sub-pixel regions Pr and Pg and using the microcavity effect and the color filters to thereby produce red and green light. Therefore, the lifetimes of the organic light-emitting diodes of the red and green sub-pixel regions Pr and Pg can be increased.

Moreover, a polarizer can be omitted from the OLED display device according to the embodiment of the present disclosure due to the microcavity effects, and thus the costs can be reduced.

Even if the OLED display device is the top emission type in the above-mentioned embodiment, the OLED display device can be a bottom emission type.

It will be apparent to those skilled in the art that various modifications and variations can be made in a display device of the present disclosure without departing from the sprit or scope of the invention. Thus, it is intended that the present invention covers the modifications and variations of this invention provided they come within the scope of the appended claims and their equivalents.

What is claimed is:

1. An organic light-emitting diode display device comprising:
   a substrate on which red, green and blue sub-pixel regions are defined;
   a first electrode in the red, green and blue sub-pixel regions, respectively;
   first, second and third light-emitting layers on the first electrode in the red, green and blue sub-pixel regions, respectively;
   a second electrode on the first, second and third light-emitting layers; and
   red, green and blue color filters on the second electrode and corresponding to the red, green and blue sub-pixel regions, respectively,
   wherein a thickness of the first light-emitting layer is smaller than a thickness of the second light emitting layer, and
   wherein a thickness of the third light-emitting layer is smaller than the thickness of the first light-emitting layer.

2. The display device of claim 1, wherein the third light-emitting layer includes a blue light-emitting material.

3. The display device of claim 1, wherein each of the first and second light-emitting layers includes a yellow light-emitting material.

4. The display device of claim 3, wherein the yellow light-emitting material has a first emission peak within a wavelength range of 530 nm to 555 nm and a second emission peak within a wavelength range of 590 nm to 620 nm.

5. The display device of claim 3, wherein the yellow light-emitting material includes 4,4'-N,N'-dicarbazole-biphenyl (CBP) and also includes bis[2-(4-tertbutylphenyl)benzothiazolato-N,C2']iridium(acetylactonate)[(t-bt)2Ir(acac)] as a dopant.

6. The display device of claim 1, wherein each of the first and second light-emitting layers includes a hole auxiliary layer, a light-emitting material layer and an electron auxiliary layer, and
   wherein a thickness of the hole auxiliary layer of the first light-emitting layer is smaller than a thickness of the hole auxiliary layer of the second light-emitting layer.

7. The display device of claim 6, wherein the thickness of the hole auxiliary layer of the first light-emitting layer corresponds to a second order cavity condition, and the thickness of the hole auxiliary layer of the second light-emitting layer corresponds to a third order cavity condition.

8. The display device of claim 6, wherein the thickness of the hole auxiliary layer of the first light-emitting layer is 250 nm to 280 nm, and the thickness of the hole auxiliary layer of the second light-emitting layer is 310 nm to 330 nm.

9. The display device of claim 2, wherein the third light-emitting layer includes a hole auxiliary layer, a light-emitting material layer and an electron auxiliary layer, and
   wherein a thickness of the hole auxiliary layer of the third light-emitting layer is smaller than the thickness of the hole auxiliary layer of the first light-emitting layer.

10. The display device of claim 9, wherein the thickness of the hole auxiliary layer of the third light-emitting layer is 30 nm to 70 nm.

11. The display device of claim 1, wherein a bank layer of an insulating material is disposed on the first electrode, the bank layer has an opening exposing the first electrode, and covers edges of the first electrode, each of the first, second and third light-emitting layers is formed on the first electrode exposed by the opening of the bank layer.

12. The display device of claim 11, wherein the bank layer has a single-layered structure or a double-layered structure.

13. The display device of claim 11, wherein the bank layer includes a first bank and a second bank on the first bank, and the first bank has a wider width than the second bank.

14. The display device of claim 13, wherein the first bank is formed of an inorganic insulating material or organic insulating material having a hydrophilic property, and the second bank is formed of an organic insulating material having a hydrophobic property.

15. An organic light-emitting diode display device comprising:
    a substrate on which red, green and blue sub-pixel regions are defined;
    a first electrode in each of the red, green and blue sub-pixel regions;
    first, second and third light-emitting layers on the first electrodes in the red, green and blue sub-pixel regions, respectively, each of the first and second light-emitting layers including a yellow light-emitting material having a first emission peak and a second emission peak different from the first emission peak;
    a second electrode on the first, second and third light-emitting layers; and
    red, green and blue color filters on the second electrode and corresponding to the red, green and blue sub-pixel regions, respectively.

16. The display device of claim 15, wherein the third light-emitting layer includes a blue light-emitting material, a thickness of the first light-emitting layer is smaller than a thickness of the second light emitting layer, and a thickness of the third light-emitting layer is smaller than the thickness of the first light-emitting layer.

17. The display device of claim 15, wherein the yellow light-emitting material has the first emission peak within a wavelength range of 530 nm to 555 nm and the second emission peak within a wavelength range of 590 nm to 620 nm.

18. The display device of claim 15, wherein the yellow light-emitting material includes 4,4'-N,N'-dicarbazole-biphenyl (CBP) and also includes bis[2-(4-tertbutylphenyl)benzothiazolato-N,C2']iridium(acetylactonate)[(t-bt)2Ir(acac)] as a dopant.

19. The display device of claim 15, wherein each of the first and second light-emitting layers includes a hole auxiliary layer, a light-emitting material layer and an electron auxiliary layer, and
    wherein a thickness of the hole auxiliary layer of the first light-emitting layer is smaller than a thickness of the hole auxiliary layer of the second light-emitting layer.

20. An organic light-emitting diode display device comprising:

a substrate on which red, green and blue sub-pixel regions are defined;

a first electrode in the red, green and blue sub-pixel regions, respectively;

first, second and third light-emitting layers on the first electrode in the red, green and blue sub-pixel regions, respectively;

a second electrode on the first, second and third light-emitting layers; and red, green and blue color filters on the second electrode and corresponding to the red, green and blue sub-pixel regions, respectively, wherein a thickness of the first light-emitting layer is smaller than a thickness of the second light emitting layer, and wherein each of the first and second light-emitting layers includes a yellow light-emitting material.

\* \* \* \* \*